United States Patent
Barrett et al.

(10) Patent No.: US 7,275,234 B2
(45) Date of Patent: Sep. 25, 2007

(54) SYSTEM AND METHOD OF AUTOMATICALLY GENERATING KERF DESIGN DATA

(75) Inventors: Howard T. Barrett, Starksboro, VT (US); Pierre J. Bouchard, South Burlington, VT (US); James B. Clairmont, Williston, VT (US); Karen S. Edwards, Milton, VT (US); Maureen F. McFadden, Burlington, VT (US); John F. Rudden, Jr., Georgia, VT (US); Florence Marie St. Pierre Sears, Crown Point, NY (US); Jeffrey C. Stamm, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 10/605,109

(22) Filed: Sep. 9, 2003

(65) Prior Publication Data

US 2005/0055661 A1 Mar. 10, 2005

(51) Int. Cl.
G06F 17/50 (2006.01)
G06F 19/00 (2006.01)
(52) U.S. Cl. .......................... 716/20; 716/19; 700/121
(58) Field of Classification Search ............ 716/19–21; 430/5; 700/121
See application file for complete search history.

(56) References Cited

U.S. PATENT DOCUMENTS

| | | | | |
|---|---|---|---|---|
| 4,510,673 A | * | 4/1985 | Shils et al. ................... 438/15 |
| 5,965,306 A | * | 10/1999 | Mansfield et al. ............ 430/22 |
| 6,330,708 B1 | * | 12/2001 | Parker et al. .................. 716/19 |
| 6,399,400 B1 | * | 6/2002 | Osann et al. .................. 438/14 |
| 6,463,577 B1 | * | 10/2002 | Omata et al. .................. 716/21 |
| 6,552,790 B1 | * | 4/2003 | Templeton et al. ......... 356/400 |
| 6,553,559 B2 | | 4/2003 | Liebmann et al. ............ 716/19 |
| 6,747,471 B1 | * | 6/2004 | Chen et al. .................. 324/765 |
| 6,774,395 B1 | * | 8/2004 | Lin et al. ...................... 257/48 |
| 6,788,074 B2 | * | 9/2004 | Sarma et al. ............... 324/663 |
| 6,824,931 B2 | * | 11/2004 | Liu et al. ........................ 430/5 |
| 7,069,525 B2 | * | 6/2006 | Bhushan et al. ............... 716/4 |
| 2002/0091985 A1 | * | 7/2002 | Liebmann et al. ............ 716/19 |
| 2003/0009739 A1 | | 1/2003 | Watanabe et al. ............. 716/19 |
| 2003/0044692 A1 | * | 3/2003 | Liu et al. ........................ 430/5 |
| 2003/0118917 A1 | * | 6/2003 | Zhang et al. ................... 430/5 |
| 2003/0126581 A1 | * | 7/2003 | Pang et al. .................... 716/19 |

OTHER PUBLICATIONS

Chiang, R et al. "From CIF to Chips", Proceedings, 1989 IEEE University/Government/Industry Microelectronics Symposium, Jun. 12-14, 1989, pp. 156-159.*

K. Ahdoot, et al., "IBM FSD VLSI Chip Design Methodology", Proceedings of Twentieth Design Automation Conference on Design Automation, Jun. 1983, pp. 39-45.

* cited by examiner

*Primary Examiner*—Jack Chiang
*Assistant Examiner*—Magid Y. Dimyan
(74) *Attorney, Agent, or Firm*—Richard M. Kotulak; Greenblum & Bernstein, P.L.C.

(57) ABSTRACT

A method and system is provided to use the same design manipulation processes for both chip design and kerf design. Concurrent generation of kerf designs and chip designs provides a consistent, accurate, and repeatable process. Improved quality of wafer testing results because the data in the kerf matches data in the chip. The total cycle time for mask manufacturing is reduced because kerf build is accomplished prior to start of the mask manufacturing process. Also provided is the use of load balancing across multiple servers during kerf and chip design to optimize computing resources.

5 Claims, 4 Drawing Sheets

SYSTEM AND METHOD OF AUTOMATICALLY GENERATING KERF DESIGN DATA

BACKGROUND OF INVENTION

1. Field of the Invention

The invention generally relates to kerf design processing during semiconductor chip design processing, in particular, to coordinating kerf design and chip design processes.

2. Background Description

Semiconductor wafers used in manufacturing chips typically have a kerf, the space on a wafer between die. This space must be large enough to allow separation of the die by culling or breaking without damage to the die. A kerf may also be known as a scribe line, a saw-kerf, or a street.

In addition to being space set aside for a dicing saw, this space may also contain a wide array of alignment and measurement sites. These sites may be used by expose tools for alignment from one process step to a previous step or steps, and they may be used by the sawing tool to align the saw blade to the kerf. The sites are used optically to measure overlay achieved from one process step to the previous step or steps.

The alignment and measurement sites may also be used by characterization engineers to monitor the critical dimensions, function and performance of devices similar to devices in the active chip. Many of these alignment and measurement sites, by their nature, do not usually require tight correlation to the active chip, but the devices used by the characterization engineers for parametric evaluation may require exact correlation to the active chip. This exact correlation is very difficult to implement.

The active chip design may go through many manipulations where process enhancing design changes are made. Designed lines may be grown or shrunk, design anchors, or serifs may be added, new layers may be derived, non-functional shapes may be added, parts of designed shapes may be removed, etc.

For there to be an exact correlation between the chip and the kerf, the kerf receives the same manipulations as the chip. Manipulations to the kerf design data are typically submitted manually, and stored in data libraries some time prior to the chip design data being sent to photo mask build. With frequent changes to the actual manipulation algorithms, there is no guarantee that the kerf design data has received the exact same manipulations as the chip design data.

Frequent changes may lead to inconsistencies between the kerf and chip design data resulting in problems with the characterization information retrieved from the kerf. It may also lead to delays in schedules if the submission of data for photo mask build is delayed due to kerf data manipulation time. Also, many versions of the same kerf design must be stored, because the kerf design data must be manipulated in various differing ways to meet specific semiconductor manufacturing line requirements. This may lead to logistical complications for the kerf designers, etc. who must maintain multiple libraries of kerf designs, and for the Product Engineers who must specify the correct version of the kerf design in their mask orders.

Currently, multiple copies of the kerf feature designs have to be stored, each having received different chip manipulation processing, in anticipation of the chip manipulation processing that might occur for the chips that would eventually specify the kerf part number. Manipulating the kerf design data prior to the chip manipulation (in some cases weeks or months prior to the chip manipulation) means there is a high risk of different versions of the design manipulation utilities being used for the kerf and chip design manipulation processing, resulting in differences in kerf and chip features in the design data and less accurate wafer testing using kerf features.

SUMMARY OF INVENTION

In an aspect of the invention, a method is provided for generating kerf data. The method includes the steps of submitting chip data for chip processing, generating kerf data corresponding to the chip data, and manipulating the kerf data via kerf processing using the same manipulation process as the chip data.

In another aspect of the invention, a method for generating kerf data is provided comprising the steps of executing design manipulation utilities for at least chip data design manipulation and creating a kerf design build utilities file by assembling kerf features previously designed and stored in a library of kerf design data as a result of kerf data manipulation. Further provided are the steps of creating and manipulating kerf design data concurrently with chip data design manipulation processing by using the same parameters in the kerf design data manipulation and chip data design manipulation thereby ensuring that the kerf design data and the chip design data are consistent.

In another aspect of the invention, a system for generating kerf data is provided. The system includes a component to submit chip data for chip processing, a component to generate kerf data corresponding to the chip data, and a component to manipulate the kerf data via kerf processing using the same manipulation process as the chip data.

In another aspect of the invention, a computer program product is provided comprising a computer usable medium having readable program code embodied in the medium and includes a first computer program code to submit chip data for chip processing, a second computer program code to generate kerf data corresponding to the chip data, and a third computer program code to manipulate the kerf data via kerf processing using the same manipulation process as the chip data.

BRIEF DESCRIPTION OF DRAWINGS

The foregoing and other objects, aspects and advantages will be better understood from the following detailed description of embodiments of the invention with reference to the drawings, in which.

DETAILED DESCRIPTION

This invention is directed to a system and method of manipulating chip design data and kerf design data concurrently so that the same manipulation processing is applied to both the chip design and the kerf design for substantially reducing errors and improving the accuracy of resulting data. Concurrent manipulation of the chip design data and the kerf design data provides for several advantages including minimized data errors, reduced design workload by designers, improved cycle time, consistent accurate repeatable process, improved quality of wafer testing because kerf matches data in the chip, and improved reliability of using kerf to test the chip (especially for multi-part number products).

The invention also provides for reduced cycle time in mask manufacturing process because the kerf build is already performed prior to the mask manufacturing process, reduction in inputs by a customer (or user) which results in improved quality and cycle time. Automatic emailing of errors in kerf generation/manipulation process reduces mean time to repair, and database tables (e.g., IBM's DB2) containing kerf build and merge log information allows quick tracing (e.g., an audit trail) of errors to products/masks and permits quicker recovery from those errors.

Additionally, the invention provides for the use of a load leveler (or a server pool balancer) to manage processing workload which provides a stable and flexible processing environment and makes more efficient use of information technology (IT) resources (and permits segregation of development work from production work and allows priority for production work, as necessary), and data is manipulated once for each photo tool used by the layers being ordered. For multi part number masks, data may be processed as it is received, and the kerf may be processed when the first chip part number data is received reducing turn around time for the masks. Attenuated phase shift masks may be made with just one run through the system as opposed to multiple runs providing faster cycle times.

Figure 1:
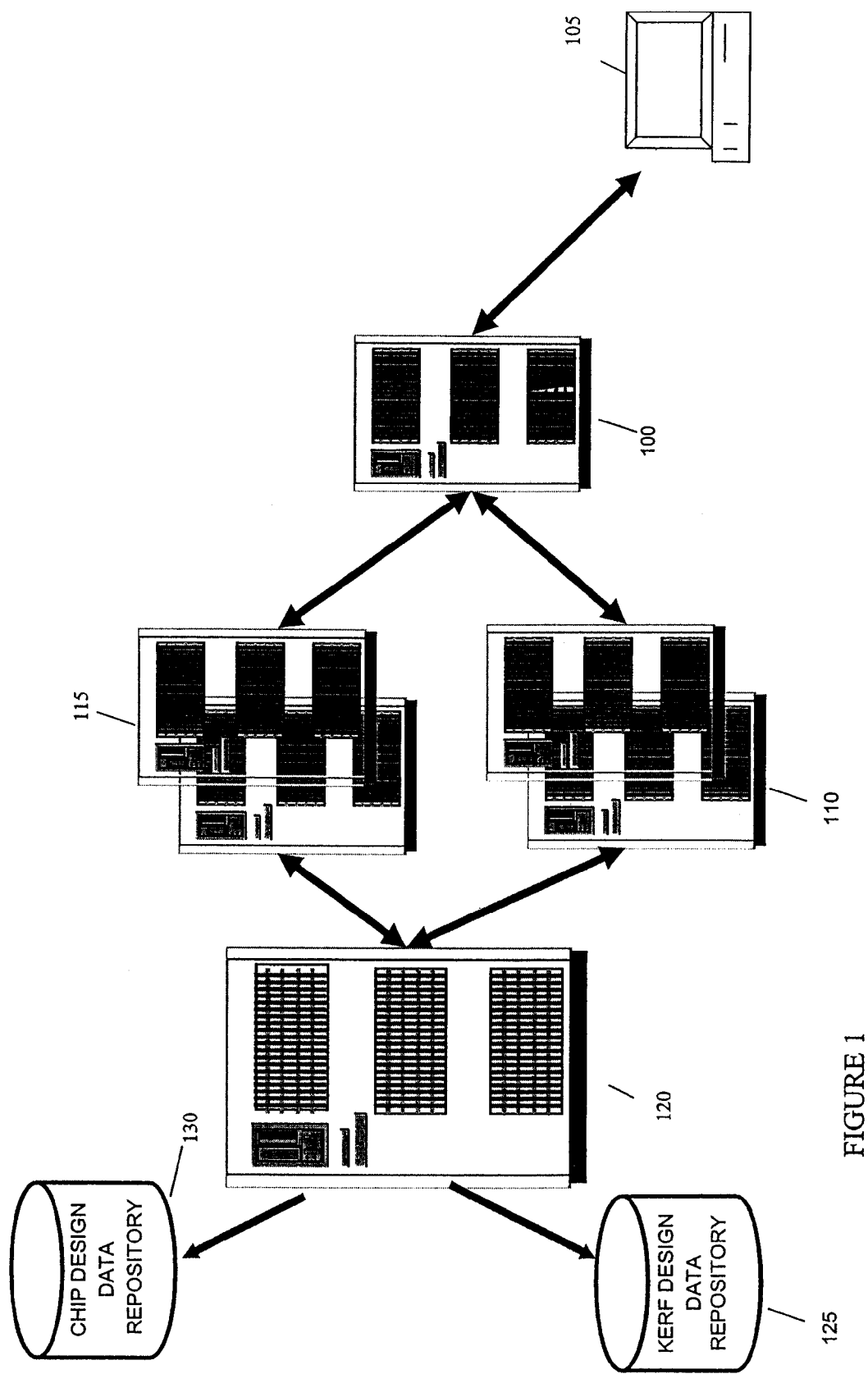
FIG. 1 is an illustrative diagram showing an embodiment of a computer architecture that may be used in conjunction with the invention.

FIG. 1 is an illustrative embodiment of a computer architecture that may be used in conjunction with the invention. Included is a server 100 for running a chip manipulation graphical user interface (GUI), associated user interface 105 (e.g., a workstation or other computer), a server pool for kerf design manipulation processing 110, a server pool for chip design manipulation processing 115, an archive server 120, a kerf design repository 125, and a chip design repository 130. Other variations may exist as one of ordinary skill in the art would recognize.

Figure 2:
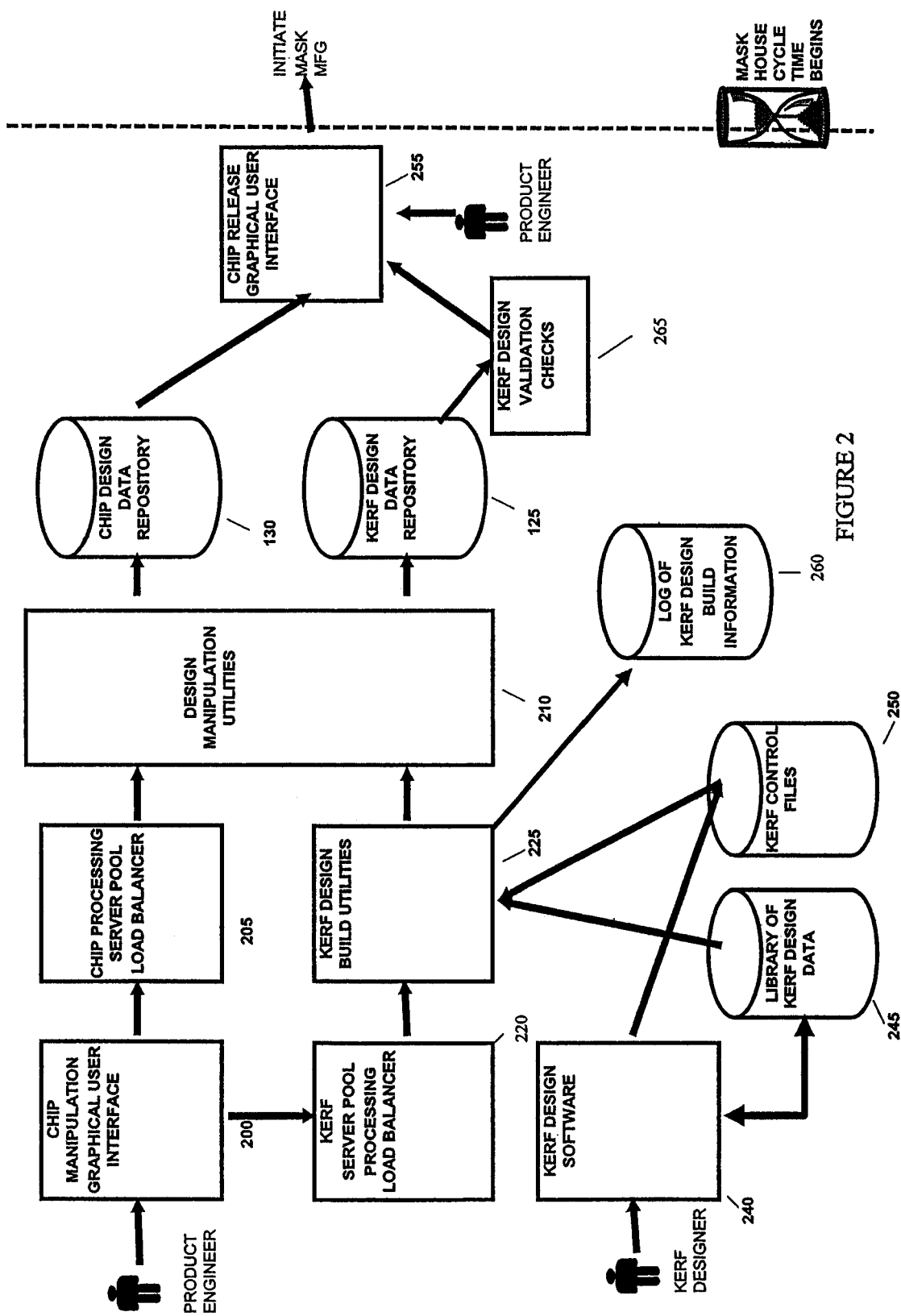
FIG. 2 is a flow diagram showing steps of using an embodiment of the invention.

FIG. 2 is a flow diagram showing steps of using an embodiment of the invention. FIGS. 2 (and FIGS. 3A-3B) may equally represent a high-level block diagram of components of the invention implementing the steps thereof. The steps of FIGS. 2-3B may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

The embodiment of FIG. 2 may include a chip manipulation Graphical User Interface (GUI) 200 which may be used to select and specify design manipulation parameters for a specific chip design data file (e.g., GL1, GDS). This GUI 200 may store the manipulation processing parameters entered by the user into a database (e.g., IBM's DB2, Oracle) or in a file. Parameters may include, for example, technologies, layers within the technology, the derivations, and options that are supported by the manufacturing line, etc. The GUI may be implemented in the form of a web application (e.g., a Websphere application executing on a Websphere server, Webspere is a known IBM Corp. product) running on a server, e.g., 100. When the user has completed entering the manipulation processing parameters, the Graphical User Interface 200 may then initiate, concurrently, both the chip design manipulation process, and the kerf creation process. Non-concurrent processing may be possible also.

The chip design manipulation process includes several steps and may begin with the Graphical User Interface at step 200 creating a computer job (e.g., scripted program) containing manipulation processing instructions and then sending it to a server load balancing utility. At step 205, this load balancing utility distributes chip manipulation processing jobs among a group of servers on which the manipulation processing may be executed, e.g., 115. Once the load balancing utility has sent the manipulation processing job to one of the servers in the server pool 115, the job then is executed on that server.

At step 210, the chip manipulation processing job executes software design manipulation utilities (e.g., Mentor Graphics Corp.'s Calibre, IBM's Niagara) to perform functions on the chip design data such as, for example, shrinks, expands, or the derivation of new data levels, the addition of processing assist features for device enhancements, addition of nonfunctional shapes for increased manufacturing line process latitude, and the like. The chip design data may be copied, via a data moving utility (e.g., FTP if the data resides on the local direct access device (dasd) of another machine, or the AIX copy (cp) command if the data resides in an andrew file system (afs)) to the server on which the chip manipulation processing is executed.

The processing parameters entered via the GUI at step 200 may be alternatively retrieved from a database or file. Additional processing parameters, which may be derived from information provided via the GUI of step 200, may also be alternatively retrieved from a database. At step 210 chip manipulation via design manipulation utilities are performed. After successful completion of the chip manipulation processing job, the modified design data may be archived in a chip design data repository 130 (e.g., MVS dasd) and may include a chip design image.

The kerf creation process includes several steps, which may be initiated concurrently with the chip design manipulation process, and may also begin at step 200 with the GUI sending a job containing the kerf creation processing instructions to a kerf server pool load balancing utility. At step 220, kerf processing may be balanced or load leveled across one or more servers. In embodiments, there may be a single server balancing the jobs which perform both the chip design manipulation processing and the jobs which perform the kerf creation processing, or there may be separate servers performing the load balancing for these two types of jobs as shown in FIG. 1 as 110 and 115. The kerf server pool load balancing utility of step 220 distributes kerf creation processing jobs among a group of servers (e.g., 110) on which the kerf creation processing may be executed.

A server may reside in both the chip manipulation processing server pool and the kerf creation processing server pool, as necessary. After the kerf load balancing utility of step 220 has sent the kerf creation job to one of the servers in the kerf creation processing server pool 110, the job is then executed on that server. Utilizing a load balancing utility 220 to distribute kerf creation processing jobs, provides both a stable and flexible processing environment, and makes efficient use of IT resources (e.g., servers in the server pools).

The kerf creation process continues and may execute at step 225 at least one of the kerf design build utilities (e.g., K2 Technology Inc.'s Mask Compose Implementation Module) in order to generate the correct kerf design file for the chip for which the chip manipulation processing job was initiated by the GUI at step 200. The correct kerf design may be determined either by information either entered via the GUI, or by information associated with the chip and/or mask order for the chip, which may be stored in a database (e.g., IBM's DB2, Oracle) or may be obtained via a file. The kerf design data receives the same manipulation at step 210 as the parallel chip design data.

By using parameters and information specified in previous operations such as the chip manipulation GUI or the mask order, user inputs are minimized thereby reducing errors due to faulty input data, and reducing customer workload. The kerf design build utilities at step 225 may create the kerf design file by assembling kerf features previously designed and stored in a library of kerf design data at step 245 (e.g., afs libraries) and kerf control files at step 250 using a kerf design software utility at step 240 (e.g., K2 Technology Inc.'s Mask Compose Definition Module). The kerf feature designs (i.e., in steps 245 and 250) typically have not received any previous manipulation processing, allowing a single version of each kerf feature design to be stored in the libraries for a particular kerf part number.

In this invention, once the kerf design file has been created, it may be manipulated in the same manner, using the same version of the design manipulation utilities (e.g., Mentor, IBM's Niagara) as was used to manipulate the chip design, e.g., at step 210. Chip design manipulation occurring substantially concurrently with the kerf design manipulation ensures that the version of software utilities used to manipulate the data is the same. In addition, since the parameters used in the chip design manipulation may have been stored in a file, database, or library, and consequently, may be read from any of these sources, the same parameters may be used in the kerf design manipulation.

Ensuring that the version of software utilities and parameters are identical ensures that the kerf design data and the chip design data receive identical manipulation processing. This, in turn, ensures that the design features in the kerf are identical to the corresponding design features in the chip, resulting in improved reliability of using the kerf to test features of the chip during wafer testing.

Another benefit of creating and manipulating kerf design data concurrently with chip manipulation processing is that features unique to the wafer fabricator may be included in the kerf design since the wafer fabricator is known at the time of chip manipulation. Following successful completion of kerf design data build and manipulation, at step 265, the resultant kerf design data may be submitted to validation checks. Such checks may include ensuring that the combination of kerf design grid and chip design grid will not cause grid snapping at the mask write tool (also referred to as database unit checking), and/or verifying that the chip data contains shapes. This validation check improves the quality of the resultant mask and chip, and reduces scrap. If the kerf design data passes all validation checks, then the kerf design data file may be archived in a data repository (e.g., MVS dasd) (e.g., 125).

In the event that an error occurs during kerf design data processing, either in the build step or in the design manipulation step, or the kerf design data does not pass the validation checks, an email may be sent to a destination such as, for example, the kerf designers indicating the nature of the problem discovered, and allowing the kerf designers or other personnel to correct the error while the chip manipulation processing is still executing. This reduces the mean time to repair the error, and also reduces cycle time for kerf design generation.

Another feature of an embodiment of this invention is that a step may be included for the logging of processing parameters used to build the kerf design data. Such log information may be stored in a database, e.g., step 260 (e.g., IBM's DB2, Oracle, etc). Log information may include information such as libraries used to build the kerf design data, version of these libraries (e.g., engineering change (EC) number of the libraries), kerf part number, kerf control file name, technology, photo tool, server name on which kerf build was executed, etc. Logging of such information in the database step 260 allows for quick and easy tracing of problem kerfs to masks which may be in use in the wafer fabricator.

Upon completion of chip manipulation processing, the finished chip design data and image may be released to mask manufacturing in order to initiate the mask build process. An embodiment of this invention may include a chip release step 255 including a GUI to facilitate this process (e.g., Websphere web application). This GUI of step 255 may be used to associate a finished chip design data file with a chip part number and mask order. Once this association is made, an email may be sent to the mask manufacturing group, or the like, to indicate that the mask build for this order and chip may begin. Prior to sending the email to the mask manufacturing group, the GUI may also check to ensure that the kerf design data for the chip has completed processing. If the kerf design data is not yet ready, then an email may be sent to the kerf design group and/or mask manufacturing group indicating that the chip has completed processing, but the kerf is not yet ready. This situation may require intervention by the kerf design group or appropriate personnel.

Building and manipulating kerf design data prior to releasing chip design data to mask manufacturing reduces cycle time for mask manufacturing, particularly for just-in-time relationships. This is especially true when multiple chip design files are merged together, along with kerf design data, during mask manufacturing. The kerf may be created, i.e. built and manipulated, at the time that the first chip design file, of the group of files to be merged, is released to mask manufacturing, rather than when the last chip design file is released to mask manufacturing. Multiple versions of kerf design images may be avoided this way.

Also, for chip design files which contain multiple layers of data in the file, the kerf design data file is manipulated once for each photo tool specified for the layers being manipulated for the chip. If multiple layers require the same photo tool, then the same kerf design data is used for all of the layers, rather than creating the kerf design data for each layer separately. This reduces processing and cycle time. This invention also allows making attenuated phase shift masks with one run through the system. Previous to the invention, each phase shift pass required a run through the system.

Figure 3A:
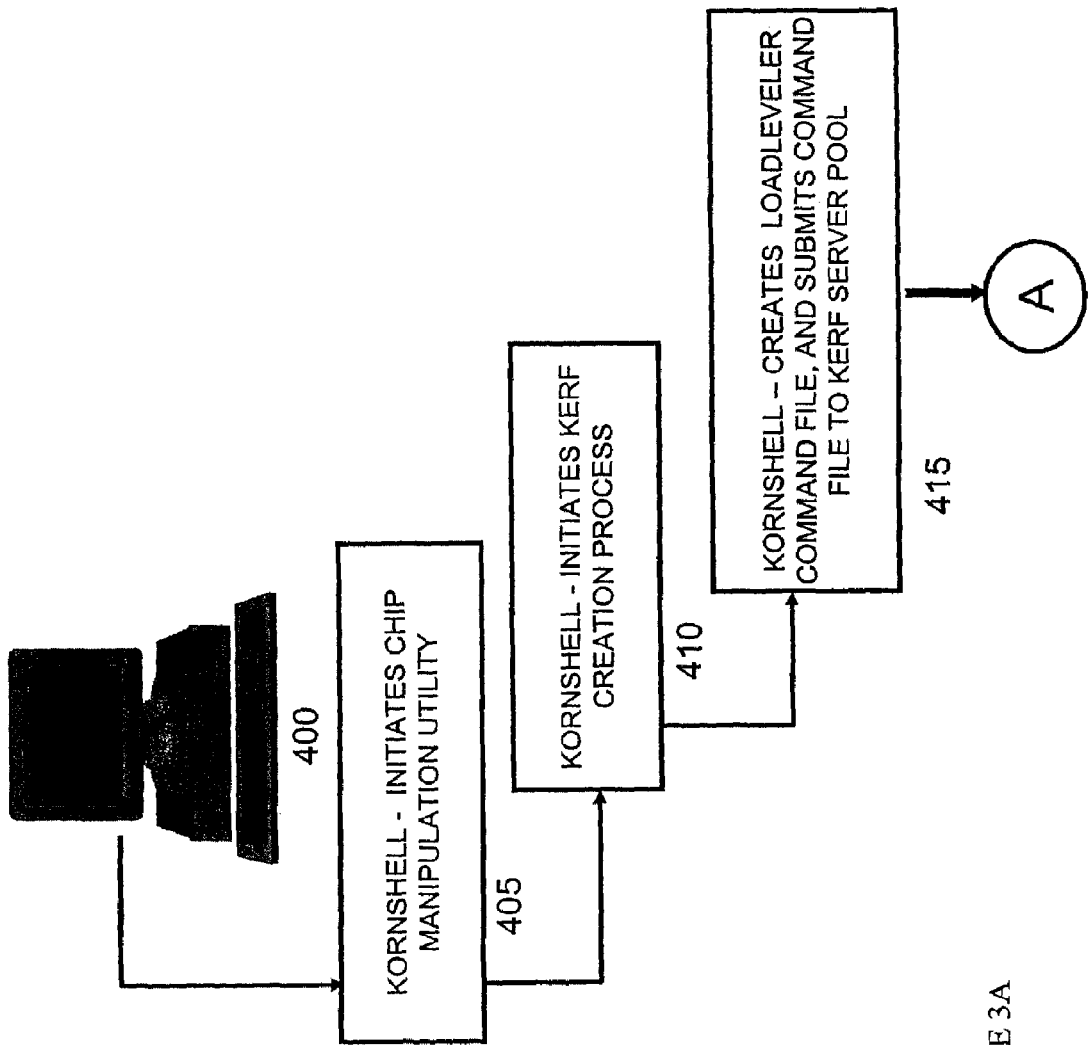
FIGS. 3A and 3B are flow diagrams showing steps of an embodiment for using the invention.
Figure 3B:
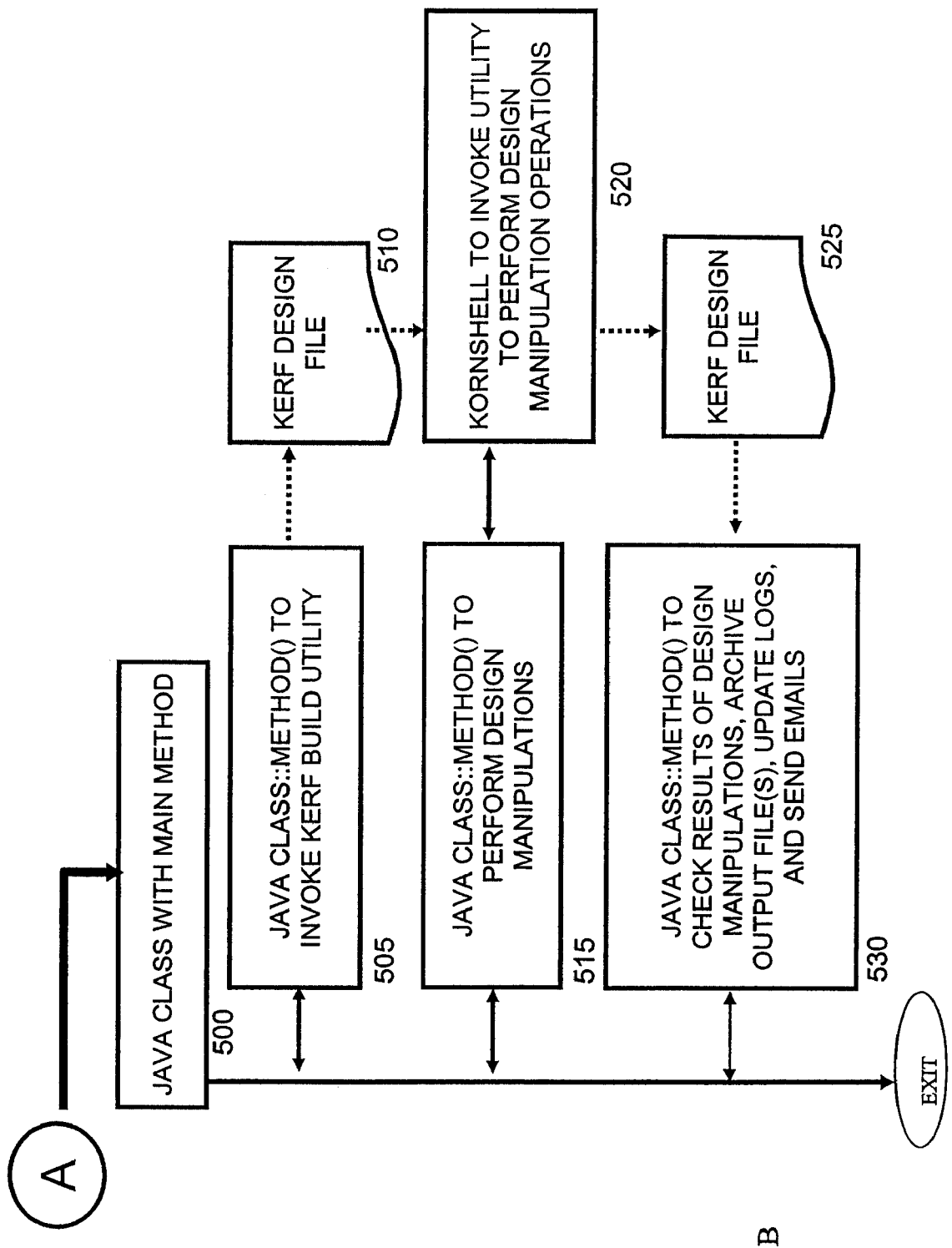

FIGS. 3A and 3B are flow diagrams showing steps of an embodiment for using the invention. A computer device 400, for facilitating the GUI of step 200 (FIG. 2) is provided. This computer device 400 enables a user via the GUI of step 200 to initiate both the chip design manipulation and the kerf creation process. The GUI of step 200 may be part of a web application (under control of a user) and at step 405, may be used to execute, for example, a Korn Shell script (or equivalent) that starts the chip manipulation process. The Korn Shell script also determines if the kerf build process is needed. If the kerf build process is needed, at step 410, a second Korn Shell script is executed for the purpose of beginning the kerf build process which may run concurrently with the chip build process. This script gathers and passes along the same parameters that were used for the chip design manipulation. This insures that the same parameters are used in both processes.

The process may include a series of Java software programs (or the like) that perform the tasks needed to build and manipulate the keff design files. This may include providing a main method at step 500 that acts as a master program that invokes all the necessary functions (e.g., 505, 515, or 530) as needed. At step 505, another Java program is called that gathers all necessary data and invokes the kerf design build utility (e.g., at step 225). At step 510, a kerf design file is produced (e.g., kerf GL1) and made available to other process steps.

At step 515, another Java program is executed to again gather parameters and to invoke step 520 which includes executing another Korn Shell script 520 (or the like) that begins the design manipulation of using the kerf design file, produced at step 510, as input. At step 525, a modified version of the kerf design file is produced. At step 530, another Java program is executed to wrap up the kerf processing by checking the results of the kerf design manipulation, archiving the manipulated design file (e.g., to data repository 235), updating processing logs (e.g., log 260), and sending email notifications of the job completion.

While the invention has been described in terms of embodiments, those skilled in the art will recognize that the invention can be practiced with modifications and in the spirit and scope of the appended claims.

The invention claimed is:

1. A method for generating kerf data, the method comprising the steps of:

executing design manipulation utilities for at least chip data design manipulation;

creating a kerf design build utilities file by assembling kerf features previously designed and stored in a library of kerf design data as a result of kerf data manipulation;

creating and manipulating kerf design data concurrently with chip data design manipulation processing by using same parameters in the kerf design data manipulation and chip data design manipulation thereby ensuring that the kerf design data and the chip design data are consistent; and following successful completion of the creating and manipulation step, submitting the kerf design data to validation checks to ensure that a combination of a kerf design grid and a chip design grid prevents grid snapping at a mask write tool.

2. The method of claim 1, wherein in the creating and manipulating step the design data includes one of shrinks, expands and derivation of new data levels.

3. The method of claim 1, wherein in the creating and manipulating step includes processing assist features for device enhancements and addition of nonfunctional shapes for increased manufacturing line process latitude.

4. The method of claim 1, wherein after successful completion of the chip data design manipulation processing, at least one of a chip design image and modified design data is archived in a chip design data repository.

5. The method of claim 1, wherein the creating kerf design data uses information associated with at least one of the chip data and a mask order for the chip, and the information is obtained from a previously created file thereby minimizing user inputs and reducing errors.

* * * * *